(12) United States Patent
Van Herpen et al.

(10) Patent No.: US 8,207,541 B2
(45) Date of Patent: Jun. 26, 2012

(54) LIGHT OUTPUT DEVICE

(75) Inventors: Maarten Marinus Johannes Wilhelmus Van Herpen, Eindhoven (NL); Markus Cornelius Vermeulen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 304 days.

(21) Appl. No.: 12/594,641

(22) PCT Filed: Apr. 7, 2008

(86) PCT No.: PCT/IB2008/051311
§ 371 (c)(1),
(2), (4) Date: Oct. 5, 2009

(87) PCT Pub. No.: WO2008/126003
PCT Pub. Date: Oct. 23, 2008

(65) Prior Publication Data
US 2010/0244695 A1    Sep. 30, 2010

(30) Foreign Application Priority Data
Apr. 12, 2007    (EP) .................................... 07106007

(51) Int. Cl.
*H01L 29/18* (2006.01)

(52) U.S. Cl. ... 257/88; 257/99; 362/249.02; 362/249.05
(58) Field of Classification Search .................... 257/88, 257/99; 362/227, 249.01, 249.02, 249.05
See application file for complete search history.

(56) References Cited

U.S. PATENT DOCUMENTS

| | | | |
|---|---|---|---|
| 5,218,351 A | 6/1993 | Hashikawa | |
| 5,352,479 A | 10/1994 | Iida et al. | |
| 6,633,322 B2 * | 10/2003 | Sakai et al. | 347/233 |
| 7,282,734 B2 * | 10/2007 | Yamazaki et al. | 257/40 |
| 7,471,706 B2 * | 12/2008 | Bass et al. | 372/21 |
| 2003/0057886 A1 | 3/2003 | Lys et al. | |
| 2005/0233125 A1 | 10/2005 | Anderson et al. | |
| 2006/0022214 A1 | 2/2006 | Morgan et al. | |

FOREIGN PATENT DOCUMENTS

| | | |
|---|---|---|
| EP | 1437215 A1 | 7/2004 |
| WO | 2004009349 A1 | 1/2004 |

\* cited by examiner

*Primary Examiner* — Thuy Vinh Tran
(74) *Attorney, Agent, or Firm* — Mark L. Beloborodov

(57) ABSTRACT

A light output device comprises a substrate arrangement and a plurality of light source devices (4) integrated into the structure of the substrate arrangement. A respective control circuit (7) is provided for one or more light source devices (4) and also integrated into the structure of the substrate arrangement. Control circuits are embedded with the light source devices into the structure of the substrate. This enables a shared control line or lines (18) to be used to control a group of light source devices.

16 Claims, 5 Drawing Sheets

LIGHT OUTPUT DEVICE

This invention relates to light output devices, in particular using discrete light sources associated with a transparent substrate structure.

TECHNICAL BACKGROUND

One known example of this type of lighting device is a so-called "LED in glass" device. An example is shown in FIG. 1. Typically a glass plate is used, with a transparent conductive coating (for example ITO) forming electrodes. The conductive coating is patterned in order to make the electrodes, that are connected to a semiconductor LED device. The assembly is completed by laminating the glass, with the LEDs inside a thermoplastic layer (for example polyvinyl butyral, PVB).

Applications of this type of device are shelves, showcases, facades, office partitions, wall cladding, and decorative lighting. The lighting device can be used for illumination of other objects, for display of an image, or simply for decorative purposes. One problem with this type of device is that it is difficult to provide a structure which enables individual LEDs in the glass to be turned on and off, for example in order to display an image, or a dynamic pattern. This is difficult, because a two-dimensional pattern of transparent electrodes is desired, but crossovers need to be avoided if the layer structure is to be kept simple. if individual wires are used for each LED (instead of a two dimensional pattern), this results in very high wire resistances (for example ITO electrodes), leading to high electrical losses in these wires.

SUMMARY OF THE INVENTION

It is an object of the invention to provide independent control of the light source devices or a group thereof, but with a relatively simple conductor pattern.

According to the invention, there is provided a light output device comprising: a substrate arrangement;

a plurality of light source devices integrated into the structure of the substrate arrangement;

a plurality of control circuits associated with the light source devices and also integrated into the structure of the substrate arrangement, wherein each control circuit comprises at least four connected connectors, with at least one connector coupled to one or more respective light source devices.

The invention provides control circuits embedded with the light source devices into the structure of the substrate. The control circuits can share connections (such as power lines) and use a shared bus-type control system, and this arrangement can thereby avoid the need for large numbers of individual conductors.

The control circuit may have 5 or 6 connectors.

Preferably, each control circuit comprises an input to which an input voltage is provided, an output for controlling the respective one or more light source devices, a control input for receiving a control signal and a control output for outputting a control signal.

This enables control circuits to be coupled together using their control inputs and control outputs. In this way, they can be provided along a common control line or set of control lines, so that the control lines can be shared between the control circuits, or groups of control circuits.

The plurality of control circuits may be connected in a series, with the control output of one control circuit connected to the control input of the next control circuit. This enables a single data line to be used to control a group of light source devices. The control signal is passed from circuit to circuit. This enables power lines (and control lines) to be defined with low resistance, wide tracks.

The control input of each control circuit is preferably adapted to receive a serial data signal and to control the switching of the input voltage to the output in dependence on one or more bits of the serial data signal. In this way, a serial data signal can be passed from control circuit to control circuit using a shared control signal line, to effect control of the multiple control circuits. For example, the control output of each control circuit can be adapted to output a serial data signal from which the one or more bits of the serial data signal have been removed. Thus, each control circuit responds to pre-allocated parts of the serial control word, and then removes these parts of the control word so that the next controller can respond to its control signal.

A drive electrode can be provided which is common to all of the plurality of control circuits and connected to each control circuit input. This can have a large area and therefore low resistance.

The output of each control circuit is preferably connected to a first terminal of the respective (two-terminal) light source device, and the device preferably further comprises a drain electrode which is common to all of the plurality of light source devices and connected to a second terminal of each light source device. Again, this can be a large area low resistance electrode.

The device may comprise a two dimensional array of light source devices and associated control circuits, wherein the light source devices and control circuits are divided into groups, each group comprising a plurality of light source devices and control circuits and a common drive electrode connected to each control circuit input. Each group also preferably comprises a common drain electrode connected to each light source device. For example, a row and column array of light source devices can be provided.

Each group can then comprise a row or column, and the common drive electrode and the common drain electrodes are also row or column lines.

The common drive electrodes of each group can be coupled together and the common drain electrodes of each group can be coupled together, for example at the edge of the array, essentially placing groups in parallel.

Alternatively, the drain electrode of a first group can be connected to the drive electrode of the second group, essentially placing groups in series.

Each control circuit may comprise a microcontroller.

In one example, each control circuit can comprise a plurality of outputs, each having a different resistance, or a different function. This enables for example different light source device brightness to be provided, by introducing different amounts of series resistance between the output of the control circuit and the light source device. It also enables for example that a reference voltage near the control circuit is substantially independent of the on/off state of the light source.

The substrate arrangement can comprise first and second substrates and an electrode arrangement sandwiched between the substrates, wherein the at least one light source is connected to the electrode arrangement. This provides an embedded light source. For example, the light source devices can each comprise an LED device or a group of LED devices.

Each control circuit may switch power between either (i) a light source device or devices, or (ii) an output resistor. This enables the voltage supply lines to remain at stable voltages, as the currents flowing can remain substantially constant regardless of whether the control circuit switches its associated light source device or devices on or off.

BRIEF DESCRIPTION OF THE DRAWINGS

Examples of the invention will now be described in detail with reference to the accompanying drawings, in which.

The same reference numbers are used to denote similar parts in the different figures.

DETAILED DESCRIPTION OF EMBODIMENTS OF THE INVENTION

Figure 1:
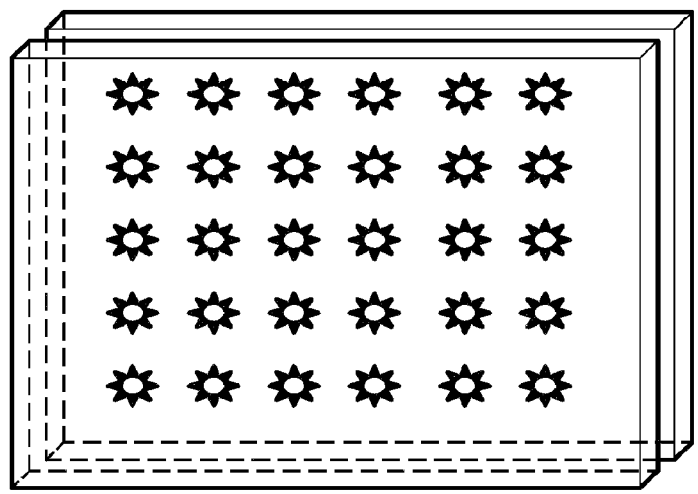
FIG. 1 shows a known LED in glass illumination device.
Figure 2:
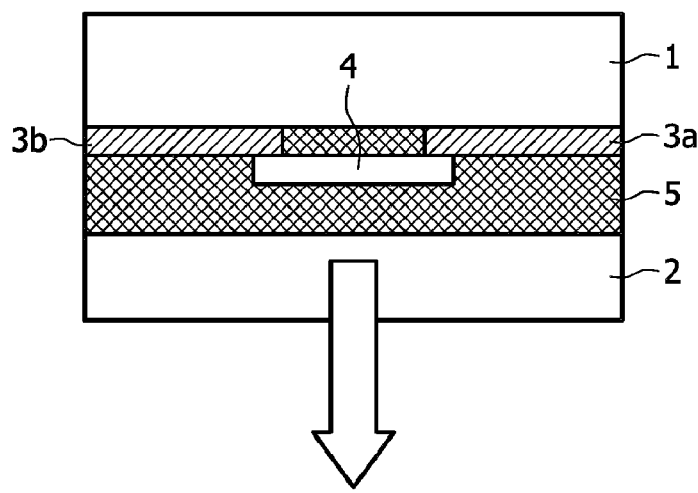
FIG. 2 shows a single LED of the device of FIG. 1 in more detail.

The structure of an LED in glass illumination device is shown in FIG. 2. The lighting device comprises glass plates 1 and 2. Between the glass plates are (semi-) transparent electrodes 3a and 3b (for example formed using ITO), and a LED 4 connected to the transparent electrodes 3a and 3b. A layer of thermoplastic material 5 is provided between glass plates 1 and 2 (for example PVB or UV resin).

The glass plates typically may have a thickness of 1.1 mm-2.1 mm. The spacing between the electrodes connecting to the LED is typically 0.01-3 mm, for example around 0.15 mm. The thermoplastic layer has a typical thickness of 0.3 mm-2 mm, and the electrical resistance of the electrodes is in the range 2-80 Ohm, or 10-30 Ohms/square.

The electrodes are preferably substantially transparent, so that they are imperceptible to a viewer in normal use of the device. If the conductor arrangement does not introduce a variation in light transmission (for example because it is not patterned, or because the pattern cannot be seen), a transparency of greater than or equal to 50% may be sufficient for the system to be transparent. More preferably, the transparency is greater than 70%, more preferably 90%, and even more preferably 99%. If the conductor arrangement is patterned (for example because thin wires are used), the transparency is preferably greater than 80%, more preferably 90%, but most preferably greater than 99%.

The electrodes can be made of a transparent material such as ITO or they can be made of an opaque material such as copper but be sufficiently thin so that they are not visible in normal use. Examples of suitable materials are disclosed in U.S. Pat. No. 5,218,351.

Figure 3:
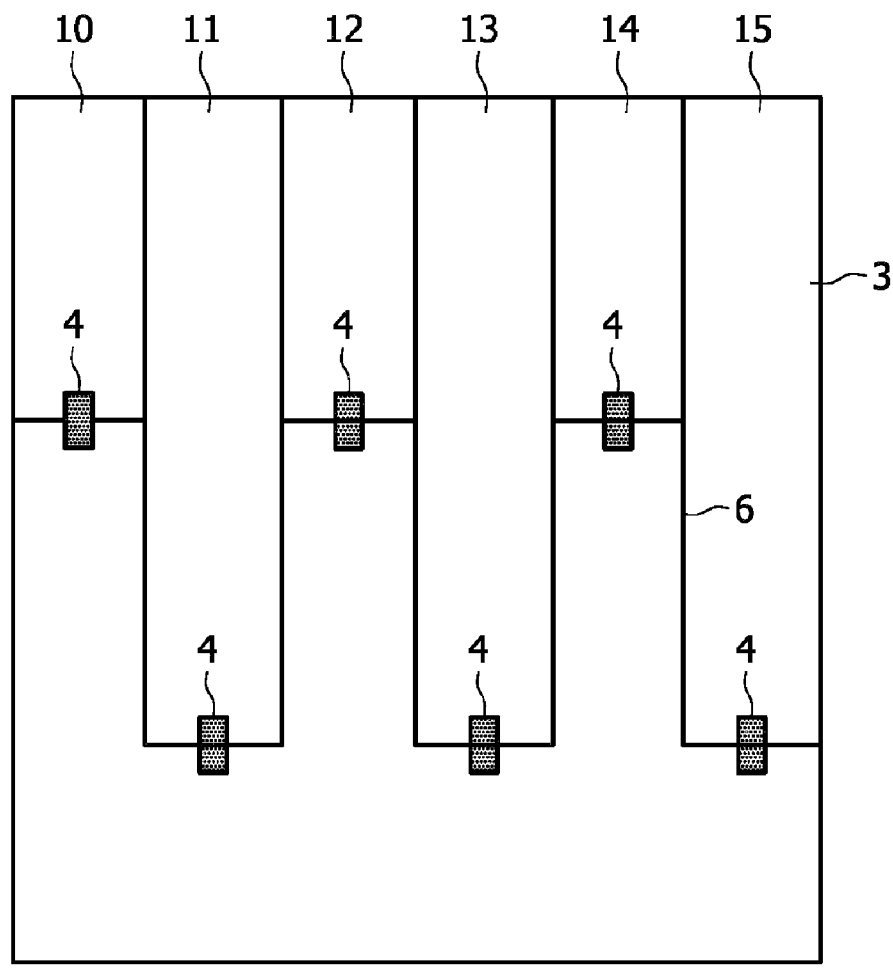
FIG. 3 shows one way to provide independent control of multiple light source devices.

FIG. 3 shows an example of an electrode pattern for controlling individual LEDs. Individual wires 10-15 are used to control several respective LEDs 4. The wires are made using a laser to make cuts 6 in a layer of electrode material 3. A problem with this solution is that the wires 10-15 are very thin, which results in a very high resistance, and accordingly in a high loss of electric power.

The current invention provides an alternative solution for controlling multiple light sources (such as LEDs) embedded in a substrate (such as glass). The control of individual light sources enables display of an image, or other dynamic pattern.

For example, the invention provides embedded microcontrollers for the light sources, in the substrate. A thin data-wire can then be used to control a full series of light sources.

Figure 4:
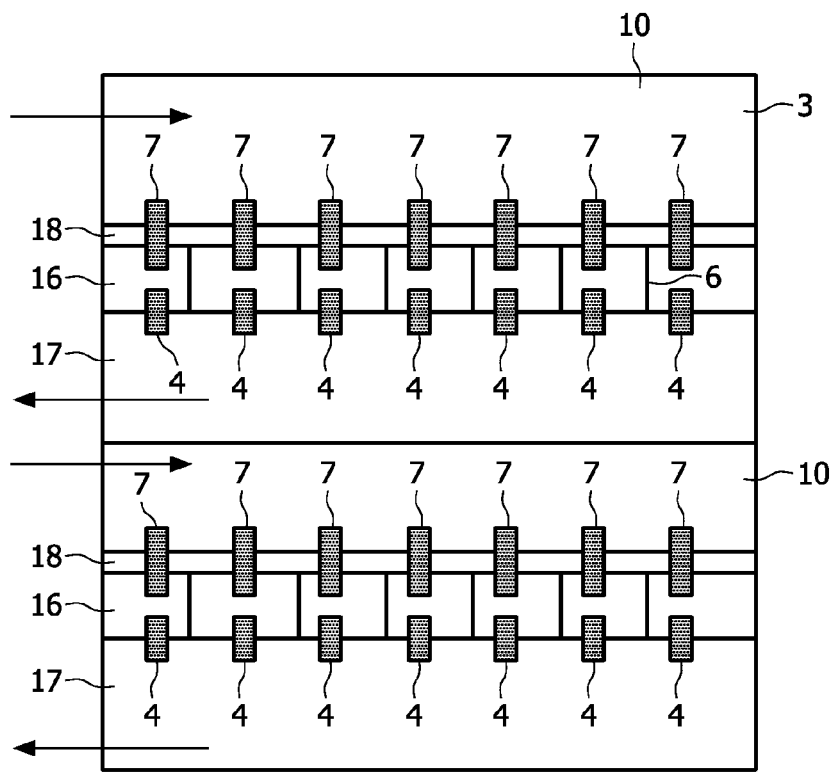
FIG. 4 shows a first example of light output device of the invention.

FIG. 4 shows a first embodiment according to the present invention. In this arrangement, a single electrode 10 is used to supply power to all LEDs 4 in one row of a row and column array of LEDs.

In order to control whether or not a LED 4 is turned on, a microcontroller 7 is associated with each LED. The microcontroller 7 has four connections. One connection is connected to an input electrode 10 common for a plurality of microcontrollers, another connection is connected to an individual output electrode 16. These define input and output signal terminals. In the example of FIG. 4, the LED 4 is connected between a respective electrode output 16 and a common electrode 17. Thus, the microcontroller 7 can control the on/off state of its corresponding LED 4 by selectively passing power from input electrode 10 to output electrode 16, which then drives the LED 4.

In order for the microcontroller 7 to determine whether or not to turn a LED 4 on, it uses data it receives from a data line 18. This data line carries a serial data string which is used to control all of the microcontrollers in the line. The data line thus connects to a control input of the microcontroller 7, and each microcontroller also has a control output, for passing the data string to the next microcontroller in a series arrangement.

FIG. 4 shows two rows of LEDs and control circuits. Each row has its own common power supply line 10 as a row line and common drain line 17 as another row line, but the common power lines can be connected together (for example at an edge of the array), and likewise, the common drain lines can be connected together. This avoids crossovers within the array area. Alternatively, the drain line 17 and the power line of the next row can be the same electrode (thus the drain line of the first and the power line of the second row are merged).

Figure 5:
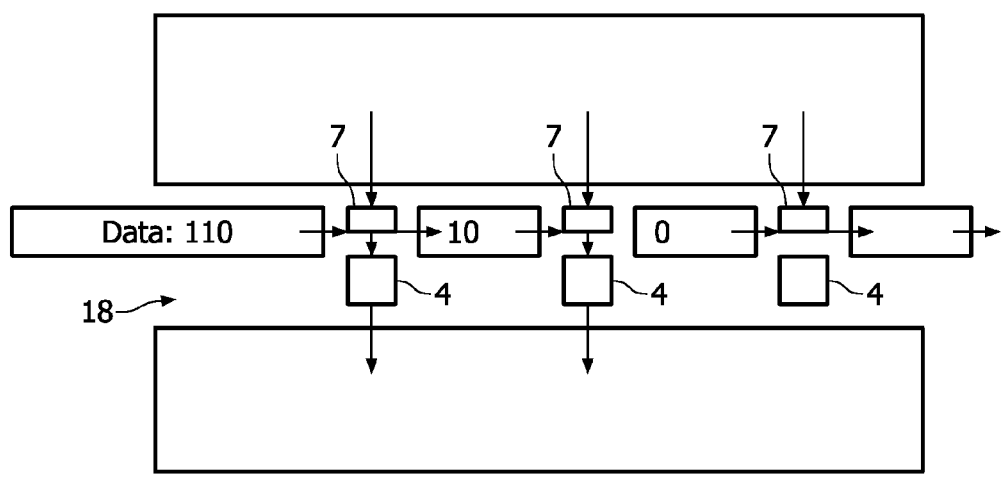
FIG. 5 is used to explain further the operation of the device of FIG. 4.

FIG. 5 shows in more detail how a string of data "110" is input to data line 18 and interpreted by the microcontrollers. The first microcontroller 7 uses the first symbol in this string "1" to determine that its corresponding LED 4 should be turned on. The microcontroller removes the first item in the data string, and forwards the remaining data "10" to the next microcontroller using the its control output, which defines the continuation of the data line 18. Similarly, the next microcontroller turns the LED on, and forwards the data "0" to the final microcontroller, which turns its LED off.

In this embodiment, only one data line 18 is shown. However, multiple data lines 18, or a combination of a data line and a low power supply for the microcontroller may be used.

As an example of a microcontroller, a 6-Pin, 8-Bit Flash Microcontroller can be used, for example PIC 10F200/202/204/206 by Microchip Technology Inc.

Figure 6:
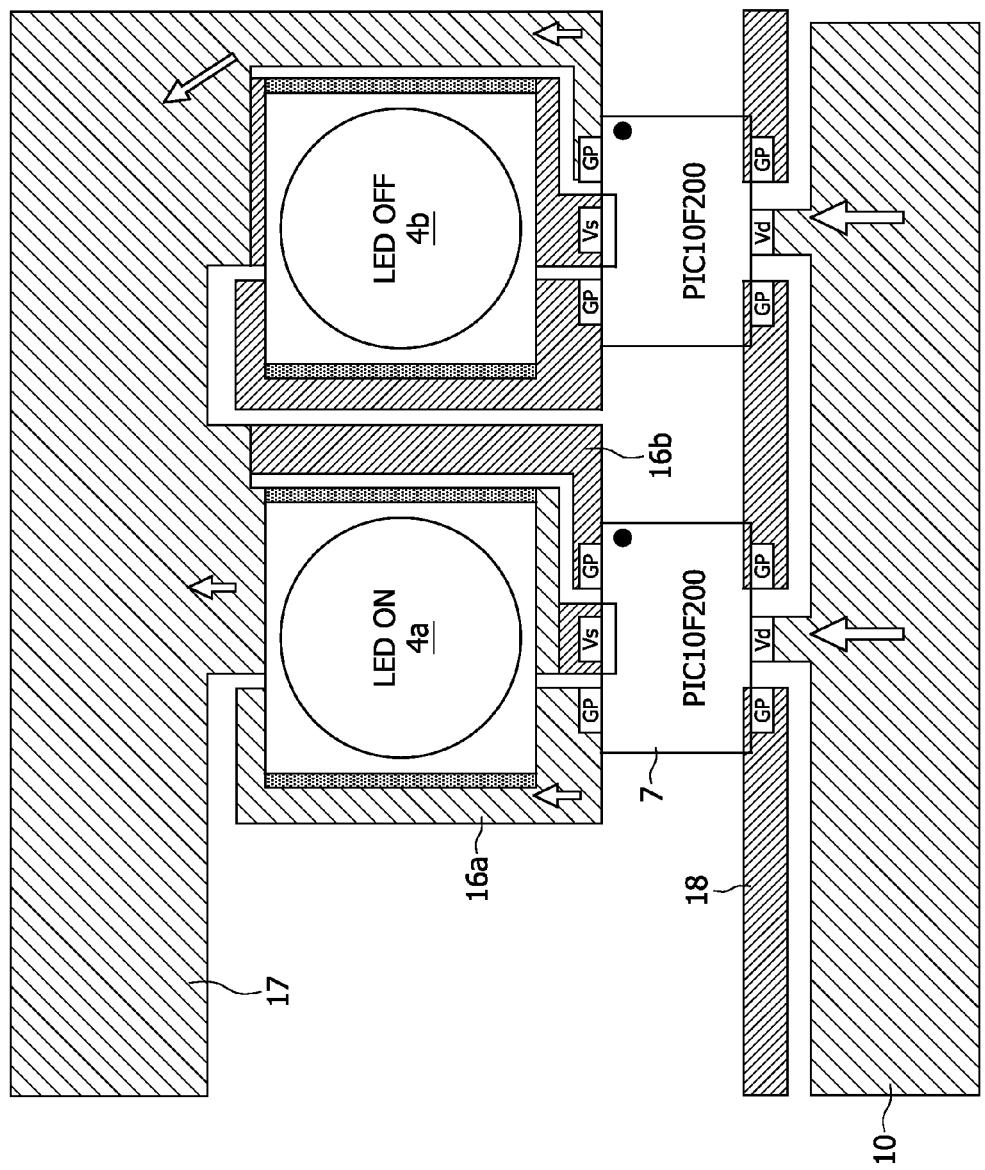
FIG. 6 shows an alternative connector layout design.

FIG. 6 shows in more detail how the system may be implemented in practice. In this embodiment, two additional problems related to the microcontroller are addressed. First, the microcontroller needs to be supplied with power, and second the power voltage on the microcontroller should stay within certain parameters.

Similar to the example described above, common electrodes 10 and 17 are provided with low resistance due to their large electrode width. The data line is again shown as 18, and the microcontrollers 7 and LEDs 4a and 4b are shown. Based on the information given by data line 18, the microcontroller 7 supplies output power to either electrodes 16a or 16b. If power is supplied to electrode 16a, the LED will turn on, as shown for LED 4a in FIG. 6.

Alternatively, if power is supplied to electrode 16b, the LED will not turn on, but power flows through line 16b (as shown for LED 4b), which is chosen to have a high resistance, such that the voltage drop across the electrode 16b is similar to the voltage that would otherwise be used for the LED. Using this approach, it is possible to achieve a stable voltage on a reference connector pin Vs of the microcontroller.

The supply voltage for the microcontroller is based on the difference between the voltage on line 10 and on pin Vs, which is the output voltage of line 16b. In this example, the output voltage of 16b equals the voltage of line 10, and thus the supply voltage is based on the voltage difference between 10 and 17. A stable voltage on lines 17 thus ensures a stable chip power supply.

The white arrows show the current flow paths, for turning LED 4a on and LED 4b off. The voltage at the output of the LEDs is the same (the voltage drop over the LED is 0 in the case of LED off, but as a result of the path 16b, the output voltage is unchanged), so that the voltages on lines 10 and 17, and the supply voltage to the microcontroller, are stable.

An additional advantage of the embodiment shown in FIG. 6 is that failure of a LED does not lead to problems for the other LEDs. This is because all LEDs and microcontrollers are connected between the same electrodes 10 and 17 in parallel.

In general, the microcontroller 7 may be any other electrical component comprising at least 4 connectors, with at least 1 connector connected to the conductor arrangement connected to the light source. Preferably it uses 2 connections for conducting electrical power, and has at least one additional input and one additional output connection for control signals.

Figure 7:
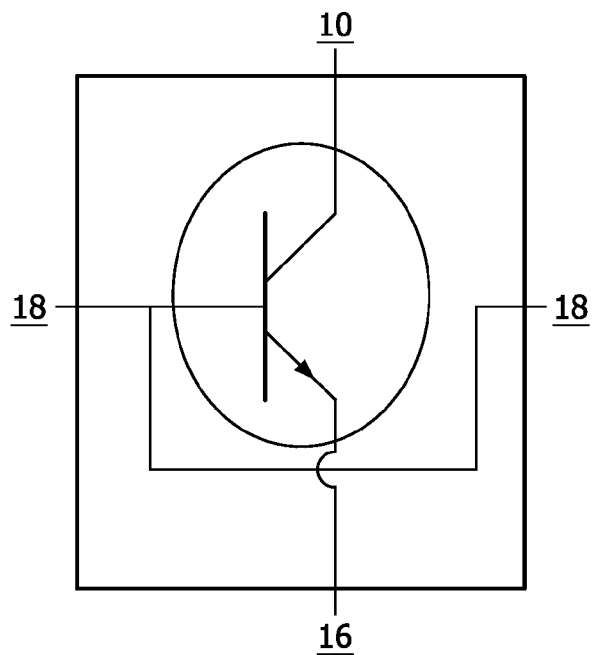
FIG. 7 shows alternative control circuit designs.

For example, a simplified device can comprise a transistor connected to the data line 18, as shown in FIG. 7. The data line switches the transistor on or off, and thereby effects switching between the common input 10 and unique output 16.

Using the device from FIG. 7, it is possible to control the on/off state of an image in the glass (the glass can either display an image, or the LEDs can be off).

In a further embodiment, the microcontroller and the LED can be combined. This may be implemented by incorporating the LED and microcontroller in one device. However, it is also possible to connect the LED to the microcontroller with a small wire. This small wire replaces electrode 16. The advantage of this is that the resistance of electrode 16 is circumvented, leading to a further reduced loss of electrical power.

Figure 8:
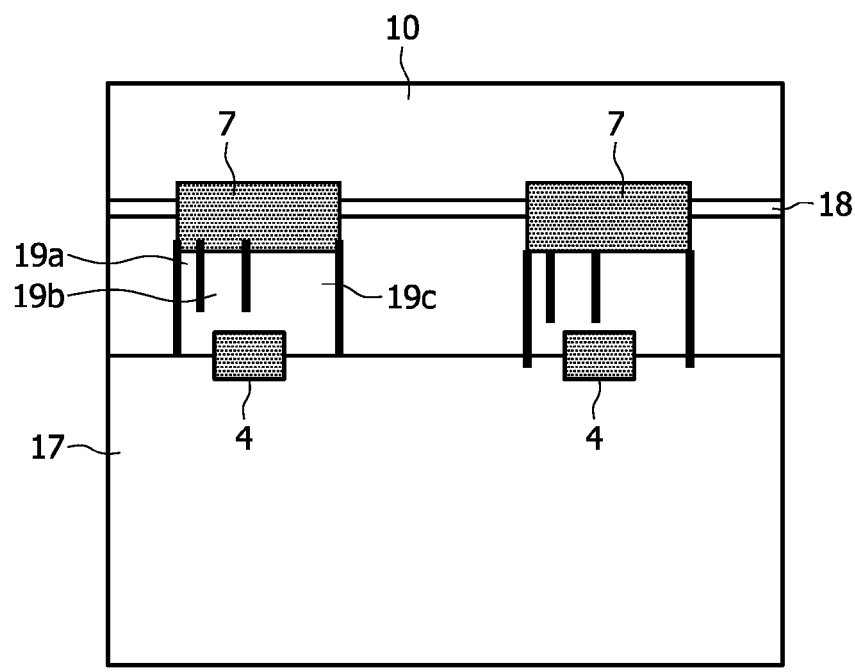
FIG. 8 shows a second example of light output device of the invention.

In a further embodiment, the microcontroller is also used to control the light intensity of the LED as shown in FIG. 8. In the example shown, this is done using a microcontroller with several output connectors leading to three electrode lines 19a, 19b, and 19c. The width and length of electrode lines 16 is chosen such that lines 19a, 19b, and 19c have a different resistance. Preferably the resistance through path 19b (including the connection resistance to the LED) is half the resistance through 19a, and 19c half that of 19b.

If the microcontroller transmits power from the common input 10 to the first output 19a, the LED will have a certain light intensity. If instead the microcontroller transmits power through the second output 19b, the LED will emit more light (preferably twice as much). In order to achieve a desired light intensity, the microcontroller may be instructed to make combinations of voltage outputs to the different output terminals 19a, 19b, and 19c.

In this example three output connectors are used for the microcontroller, but in practice this number may vary.

Another method for controlling the intensity of a LED is achieved by periodically switching the LED on and off (e.g. using a method known in the art as pulse width modulation). In the current invention, this can be done locally by each control circuit. Based on the input signal the control circuit can locally modulate the on/off state of the LED, in order to control its brightness (or the input signal may be modulated). This method works especially well in a system such as FIG. 6. The advantage of local modulation is that not the entire conductor arrangement needs to be modulated. This limits the generation of electromagnetic radiation, which would otherwise be generated by the entire conductor arrangement.

The examples above have shown the light paths associated with individual light sources. However, it will be understood that the invention is typically implemented as many LED devices, embedded in a large glass plate. A typical distance between the LEDs may be 1 cm to 10 cm, for example approximately 3 cm.

Each light source may also comprise a single LED or multiple LEDs and one control circuit may control multiple light sources. When one control circuit is for multiple light sources, they may be different colours, for example red, green and blue, thus defining colour sub-pixels of a single colour light source.

The examples above use glass substrates, but it will be apparent that plastic substrates may also be used.

A small number of possible materials to form the transparent (or at least semi-transparent) electrodes have been outlined above. Other examples can be found in U.S. Pat. No. 5,218,351, and include electrically conductive wires, with a diameter of approximately 0.1 mm spaced by about 10 mm or more, or with a diameter of approximately 20 um and spaced by 1 mm or more. The wires can be made from strands of gold, silver, copper, zinc or stainless steel. Alternatively, strands made of a resin such as polyester or nylon wires can be used, the outer surface of which is coated with metal by vapour deposition, metal plating or the like. Conductive films of vapour-deposited SiO2-indium alloy can also be used.

One particularly preferred material is a conductive ink, which can be deposited by inkjet or silkscreen printing. The ink includes fine metal particles, such as silver, and has a conductance of less than 0.1 Ohm/square/mil. A typical wire width using ink is 0.08 mm to 0.8 mm.

Other electrical components may additionally be embedded into the structure of the device.

The LED and the control circuit may be merged into one integrated device, or they may be connected with a low-resistance wire.

In the examples above, the control circuit is for controlling brightness. Another function of the control circuit may be a programmed sequence of on/off states. For example, the control circuit may be instructed to let the LED blink on/off with a period of 1 second. Alternatively, it may be instructed to randomly turn the LEDs on/off with a predetermined average frequency (e.g. 1 Hz). Alternatively, it may be instructed with a sequence of on/off states which it will keep playing from the start of this sequence.

Thus, the control circuits can be used to implement a variety of programmable optical functions and effects. A lighting controller for the overall device is provided for controlling these effects, for controlling the signals provided to the individual control circuits.

Various modifications will be apparent to those skilled in the art.

The invention claimed is:

1. A light output device comprising:
a substrate arrangement;
a plurality of light source devices integrated into the substrate arrangement;
a plurality of control circuits respectively associated with the plurality of light source devices and integrated into the substrate arrangement; and
an input power supply electrode and an output power drain electrode, the input power supply electrode being common to at least the plurality of control circuits and the output power drain electrode being common to at least the plurality of light source devices,
wherein each control circuit comprises at least four connected connectors, with at least one connector coupled to at least one respective light source device, and
wherein each control circuit is configured to selectively switch between
the at least one respective light source device
and an output resistor connected between the input power supply electrode and the output power drain electrode, providing power from the input power supply electrode to the selected one of the at least one respective light source device and the output resistor.

2. The device as claimed in claim 1, wherein at least one control circuit comprises an input to which an input voltage is provided, an output for controlling the respective at least one light source device, a control input for receiving a control signal and a control output for outputting a control signal.

3. The device as claimed in claim 2, wherein the control input of each control circuit is configured to receive the control signal in the form of a serial data signal and to control the switching of the input voltage to the output in dependence on one or more bits of the data signal.

4. The device as claimed in claim 2, wherein the plurality of control circuits are connected in a series, with the control output of one control circuit connected to the control input of the next control circuit.

5. The device as claimed in claim 2, wherein the output of each control circuit is connected to a first terminal of the respective light source device, and wherein the output power drain electrode is connected to a second terminal of each light source device of the plurality of light source devices.

6. The device as claimed in claim 5 wherein The plurality of light source devices and the associated plurality of control circuits are arranged in a two dimensional array, wherein the light source devices and control circuits are divided into groups, each group comprising a plurality of light source devices and associated control circuits and a common drive electrode connected to each control circuit input.

7. The device as claimed in claim 6, wherein each group comprises a common drain electrode connected to each light source device.

8. The device as claimed in claim 6, wherein each group comprises a row or column, and wherein the common drive electrode is a row or column line and the common drain electrode is a row or column line.

9. The device as claimed in claim 1, wherein the substrate arrangement comprises first and second substrates and an electrode arrangement sandwiched between the first and second substrates, wherein the at least one light source device of the plurality of light source devices is connected to the electrode arrangement.

10. The device as claimed in claim 1, wherein the each light source device of the plurality of light source devices comprises an LED device or a group of LED devices.

11. A light output device comprising:
a plurality of light source devices embedded in a substrate;
a plurality of controllers embedded in the substrate and configured to control corresponding light source devices of the plurality of light source devices in response to a control signal;
a power input electrode common to the plurality of controllers;
a power output electrode common to the plurality of light source devices; and
a data line connecting the plurality of controllers in series and configured to provide the control signal to the plurality of controllers, each controller of the plurality of controllers selectively connecting the corresponding light source device of the plurality of light source devices to the power input electrode in response to the control signal for selectively turning on the corresponding light source device.

12. The device of claim 11, further comprising:
a plurality of high resistance paths corresponding to the plurality of controllers, each controller of the plurality of controllers selectively connecting the corresponding high resistance path of the plurality of high resistance paths to the power input electrode, bypassing the corresponding light source device, in response to the control signal for selectively turning off the corresponding light source device.

13. The device of claim 11, wherein the control signal comprises a string of control data having a plurality of bits corresponding to the plurality of controllers, respectively.

14. The device of claim 11, wherein the plurality of controllers and the corresponding plurality of light sources are connected in parallel with one another.

15. A light output device comprising:
first and second LEDs embedded in a substrate;
first and second microcontrollers embedded in the substrate and configured to control the first and second LEDs, respectively, in response to a control signal; and
a data line connecting the first microcontroller in series with the second microcontroller and configured to provide the control signal to the first and second microcontrollers, the first microcontroller selectively connecting the first LED to a power input electrode in response to a first bit of the control signal and the second microcontroller selectively connecting the second LED to the power input electrode in response to a second bit of the control signal.

16. The device of claim 15, wherein the first microcontroller comprises a first connector connected to the power input electrode, a second connector connected to the first LED, a third connector connected to the data line to input the control signal, and a fourth connector connected to the data line to output the control signal, and
wherein the second microcontroller comprises a first connector connected to the power input electrode, a second connector connected to the second LED, a third connector connected to the data line to input the control signal from the first microcontroller, and a fourth connector connected to the data line to output the control signal.

* * * * *